United States Patent
Markovich et al.

(10) Patent No.: US 8,240,031 B2
(45) Date of Patent: Aug. 14, 2012

(54) METHOD OF JOINING A SEMICONDUCTOR DEVICE/CHIP TO A PRINTED WIRING BOARD

(75) Inventors: Voya R. Markovich, Endwell, NY (US); Ronald V. Smith, Friendsville, PA (US); How T. Lin, Vestal, NY (US); Frank D. Egitto, Binghamton, NY (US); Rabindra N. Das, Vestal, NY (US); William E. Wilson, Waverly, NY (US); Rajinder S. Rai, Vestal, NY (US)

(73) Assignee: Endicott International Technologies, Inc., Endicott, NY (US)

( * ) Notice: Subject to any disclaimer, the term of this patent is extended or adjusted under 35 U.S.C. 154(b) by 0 days.

(21) Appl. No.: 12/837,640

(22) Filed: Jul. 16, 2010

(65) Prior Publication Data

US 2012/0015532 A1   Jan. 19, 2012

(51) Int. Cl.
*H05K 3/30*   (2006.01)
(52) U.S. Cl. ......... 29/832; 29/830; 29/831; 29/840; 29/842; 29/866
(58) Field of Classification Search ........ 29/852, 29/832, 866, 837, 838, 842, 854; 174/262, 174/263, 266; 361/782, 764, 765, 761, 762
See application file for complete search history.

(56) References Cited

U.S. PATENT DOCUMENTS

| | | | |
|---|---|---|---|
| 5,137,461 A | 8/1992 | Bindra et al. | |
| 5,207,585 A | 5/1993 | Byrnes et al. | |
| 5,949,654 A * | 9/1999 | Fukuoka | 361/760 |
| 6,156,484 A | 12/2000 | Bassous et al. | |
| 6,242,282 B1 | 6/2001 | Fillion et al. | |
| 6,370,013 B1 * | 4/2002 | Iino et al. | 361/306.3 |
| 7,594,317 B2 * | 9/2009 | Nakamura | 29/832 |
| 2007/0025092 A1 * | 2/2007 | Lee et al. | 361/761 |

\* cited by examiner

*Primary Examiner* — Derris Banks
*Assistant Examiner* — Tai Nguyen
(74) *Attorney, Agent, or Firm* — Mark Levy; Hinman, Howard & Kattell, LLP

(57) ABSTRACT

A flexible, high density decal and the use thereof methods of forming detachable electrical interconnections between a flexible chip carrier and a printed wiring board. The flexible decal has fine-pitch pads on a first surface and pads of a pitch wider than the fine pitch on a second surface, the fine-pitch pads on the first surface designed to electrically connect to a semiconductor device, and the wider-pitch pads on the second surface designed to electrically connect to a printed wiring board or the like. The pads on the first surface are conductively wired to the pads on the second surface through one or more insulating levels in the flexible decal.

16 Claims, 3 Drawing Sheets

METHOD OF JOINING A SEMICONDUCTOR DEVICE/CHIP TO A PRINTED WIRING BOARD

FIELD OF THE INVENTION

The present invention pertains to high density decals and, more particularly, to a method of removably attaching a semiconductor chip to a printed wiring board using a high density decal.

BACKGROUND OF THE INVENTION

Semiconductor devices (chips) are typically provided with a high density of electrical contacts on one surface, arranged in a patterned array with constant dimensions and small spacing or pitch between the centers of the contacts. The contacts may be pads or bumps.

Historically, in first level packaging the chips were mounted on a rigid carrier with matching electrical contacts, encapsulated and hermetically sealed in metal or plastic packages. The carrier redistributed the electrical contacts over a larger area and made it compatible for mounting on a printed circuit board (PCB) or printed wiring board (PWB) known as second level packaging. Conventionally the electrical connection between the chip and carrier in the first level package has been permanent by means of solder, wirebond and the like and not amenable to easy removal or reworking. The second level interconnection of the carrier to the PWB have similarly been permanent or at best difficult to rework via solder.

Conventional interconnection methods give rise to two problems. In the first instance, the mismatch in the thermal expansion coefficients of the chip substrate, usually silicon, and the carrier result in stress during the assembly process and also during operation of the device. Rigid carriers similarly acquire and retain residual stress during second level assembly. Such stress often leads to early failure of the electrical contacts either at the first or the second level interconnections.

One method of overcoming this deficiency has been to use additional reinforcing adhesive to provide mechanical support for the interconnections. A second method known in the art has been the use of flexible thin film carriers to accommodate the stress as disclosed in U.S. Pat. Nos. 5,207,585 to Byrnes et al. and 6,242,282 to Fillion et al. The '585 patent discloses a thin interface pellicle probe for making temporary or permanent interconnections to pads or bumps on a semiconductor device wherein the pads or bumps may be arranged in high density patterns incorporating an electrode for each pad or bump. The electrode has a raised portion thereon for penetrating the surface of the pad or bump to create sidewalls, providing a clean contact surface; and the electrode has a recessed surface to limit the penetration of the raised portion. The electrodes may be affixed to a thin flexible membrane to permit each contact to have independent movement over a limited distance and of a limited rotation.

The '282 patent discloses a method for packaging at least one circuit chip which includes: providing an interconnect layer including insulative material having a first side and a second side, initial metallization patterned on metallized portions of the second side and not on non-metallized portions of the second side, at least one substrate via extending from the first side to one of the second side metallized portions, and at least one chip via extending from the first side to one of the second side non-metallized portions; positioning the circuit chip on the second side with at least one chip pad of the circuit chip being aligned with the chip via; and patterning connection metallization on selected portions of the first side of the interconnect layer and in the vias so as to extend to the second side metallized portion and to the chip pad.

The second problem associated with rigid as well as flexible carriers is related to testing, burn-in, and removal/reworking of the interconnects. The devices require firm, reliable electrical/ohmic contacts with the carrier and PWB during testing and burn-in. However the process also demands easily detachable chip-to-carrier or carrier-to-PWB joints, should the device or the electrical interconnects be found defective. Conventional rework methods introduce additional thermal cycles on the assembly and often damage the device or the PWB.

Temporary interconnection techniques for test probes are the subject of U.S. Pat. Nos. 6,156,484 to Bassous et al. and 5,137,461 to Bindra et al. The '484 patent discloses a sculpted probe pad and a gray scale etching process for making arrays of such probe pads on a thin flexible interposer for testing the electrical integrity of microelectronic devices at terminal metallurgy. Also used in the etching process is a fixture for holding the substrate and a mask for one-step photolithographic exposure. The result is an array of test probes of preselected uniform topography, which make ohmic contact at all points to be tested simultaneously and nondestructively.

The '461 patent discloses a separable and reconnectable connection for electrical equipment that is suitable for miniaturization in which vertical interdigitating members integrally attached and protruding from a planar portion are accommodated to control damage in lateral displacement that occurs on mating with an opposite similar contact.

Although not disclosed in the aforementioned patents, test probes often require special jigs and fixtures to hold the joined pads at high pressures. As the density of the electrical contacts on devices progressively increases, the reliability of the ohmic contacts in the above cited probes decreases.

None of the cited references teaches a high density decal for removably attaching a device to a PWB which can optionally be removed and reworked, or permanently attached.

Accordingly it is one object of this invention to removably connect a chip to a printed wiring board using a high density decal wherein the decal redistributes the electrical contacts on the PWB.

It is another object of the invention to removably connect a chip to a printed wiring board using a high density decal wherein the removable interconnections are substantially stress-free.

It is yet another object of the invention to removably connect a chip to a printed wiring board using a high density decal wherein little or no force is employed in making the ohmic contact.

The term decal is used interchangeably with the terms pellicle, interposer, and carrier and is defined hereinbelow.

The terms removable and detachable are used interchangeably to mean easy separation by art-accepted means including mechanical, thermal, chemical and physical means, such as optical, acoustic and the like, with insignificant or no damage to the components being separated.

SUMMARY OF THE INVENTION

In accordance with the present invention, there is provided a chip attached to a high density decal and a method of detachably attaching the decal to a PWB. A flexible decal has fine-pitch pads on a first surface and pads of a wider pitch on a second surface, the fine pitch pads on the first surface designed to electrically connect to a semiconductor device, the wider-pitch pads on the second surface designed to electrically connect to a printed wiring board or the like, and the pads on the first surface being conductively wired to the pads on the second surface through one or more insulating levels in the flexible substrate.

BRIEF DESCRIPTION OF THE DRAWINGS

A complete understanding of the present invention may be obtained by reference to the accompanying drawings, when considered in conjunction with the subsequent detailed description, in which.

DETAILED DESCRIPTION OF THE PREFERRED EMBODIMENT

Generally speaking, the present invention is directed to a method of removably forming an electrical interconnection between an integrated circuit chip and a PWB using a flexible decal.

Figure 1:
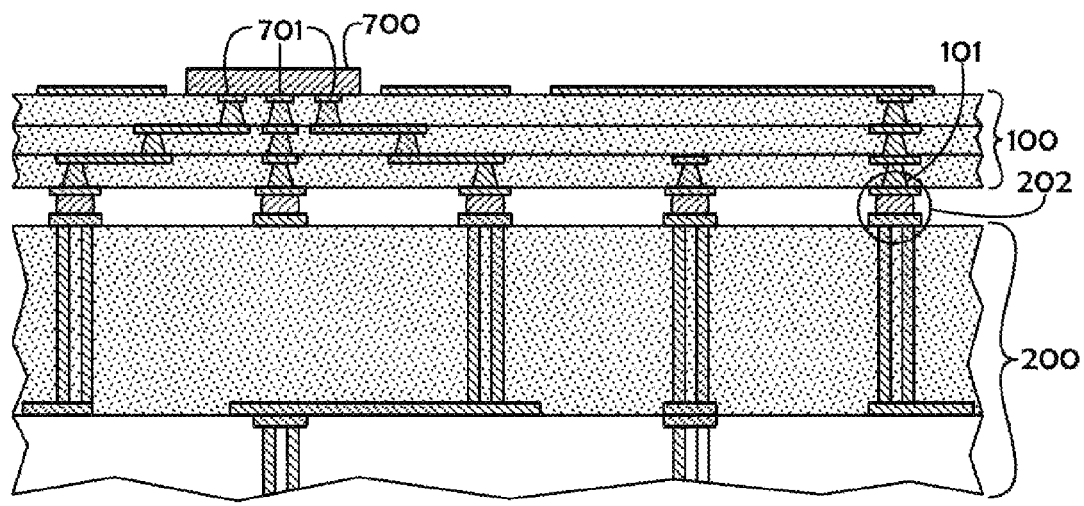
FIG. 1 depicts a device mounted on a decal removably attached to a PWB, in accordance with the present invention.

As shown in FIG. 1, an integrated circuit chip 700 is mounted on a flexible decal 100. The closely spaced contacts 102 on a first surface of the decal 100 match the contacts 701 of the chip 700. The decal 100 has multiple levels of circuitry that redistribute the interconnections 300 to a wider pitch 101 on the second surface 103 of decal 100. A PWB 200 has an opposing surface with contacts 202 where the decal 100 is attached. The invention is directed to a method of removably attaching the decal 100 to the PWB 200 and the structure of the electrical interconnections 300 between the opposing contacts 101 and 102.

Figure 2:
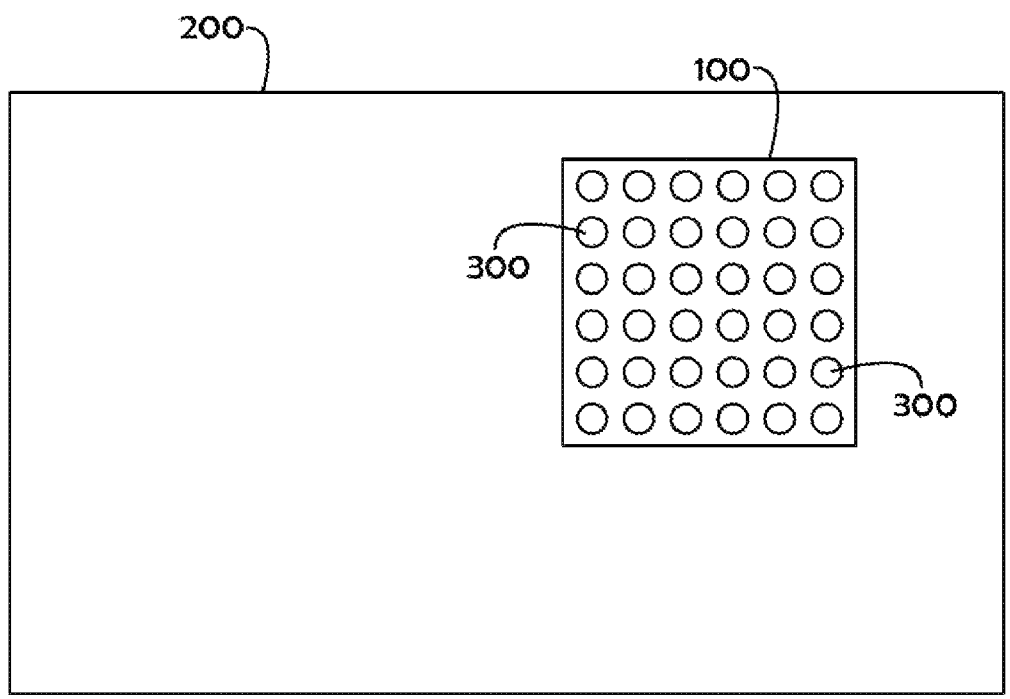
FIG. 2 depicts the relative sizes of a high density island on a PWB.

FIG. 2 depicts the relative dispositions of the flexible decal 100, PWB 200 and the spaced contacts 102. In conventional joining techniques, pads are soldered or welded together and are difficult or impossible to rework without damaging the components.

Figure 4:
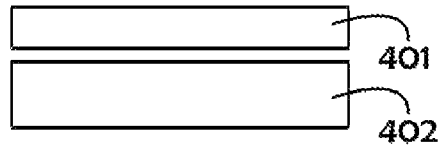
FIG. 4 shows a prior art Au—Sn pad joint that is not reworkable.

As shown in FIG. 4 the metallurgy of prior art opposing pads 401 and 402 may comprise Au-plated Sn contacts, pressed together and diffusion-bonded (i.e., welded at high temperatures). The weld is not reversible.

Figure 3:
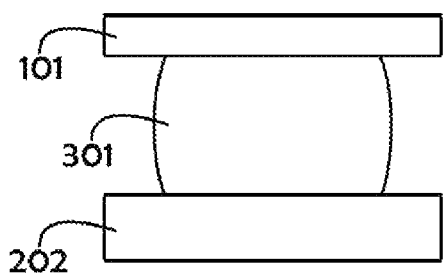
FIG. 3 shows a bump-joint.

In another conventional technique, pads 101 and 202 are joined together by a solder bump 301 (FIG. 3). In this instance, if required, the decal 100 may be removed from PWB 200 by softening the solder joint 301 at a suitable temperature above the melting point of the solder. However this thermal regime stresses all other components, not shown, on PWB 200.

The instant invention overcomes these shortcomings by forming a temporary detachable bond for testing and burn-in followed by a process of making a permanent bond.

In one embodiment the solder-bump 301 (FIG. 3) of the conventional process is replaced by an electrically conductive adhesive (ECA) bump. Diverse ECAs are known in the art and have been widely used to mount chips directly on PWBs in so-called direct-chip-attach (DCA) technologies. Commercially available ECAs (ECCOBOND 56 C, SEC 1233, ECCOBOND 57 C, two component, silver filled, electrically conductive epoxy adhesive) are within the scope of the instant disclosure.

The ECA may comprise electrically conductive particles, preferably metal particles, disposed in a thermoplastic epoxy. Analogous to the soldering operations, the electrical interconnections are made using ECA bumps in the conventional manner. If initial testing indicates a defective die (chip) or decal, the decal can be removed without damage to the chip or the PWB by softening the epoxy. Generally speaking, these are low temperature operations compared to soldering and are relatively stress free.

In another embodiment, the epoxy of the ECA may be amenable to two-stage curing. For the initial testing phase, the epoxy may be B-cured, in which stage it is easily removable by dissolution in a solvent or via other known techniques.

Thermosetting resin blends in the ECA may permit low-temperature detachable thermoplastic connections made as described above with a second stage curing of the thermoset-resin at a higher temperature to obtain a permanent electrical interconnection.

In yet another embodiment, the two-stage curing may comprise UV-curing of one UV-curable resin in the blend in the first stage; this may be followed by thermal curing the resin to form a durable interconnection.

Significantly, the ECA as used in this embodiment includes a metal component including nano-particles. Metals which may form the nano-particles include copper, silver, gold, silver-coated copper, gold-coated copper, and alloys thereof. In one embodiment of the invention, an ECA having silver nano-particles may be used. ECA may include micro-particles of metal (including silver), micro-particles of solder, and, in some situations, the addition of a conducting polymer and, even further, the addition of an organic composition. An important aspect of this invention is that the ECA particles will not melt during B-curing, but will melt during the final, full curing process. Suitable additional metal, including solder, for use in the compositions taught herein may be referred to as low melting point (LMP) metallurgies, and are mixed with the primary metal particles (e.g., silver or a silver-copper mixture). These LMP metallurgies include tin-lead, bismuth-tin, bismuth-tin-iron, tin, tin-silver, tin-gold, tin-silver-zinc, tin-silver-zinc-copper, tin-bismuth-silver, tin-copper, tin-copper-silver, tin-indium-silver, tin-antimony, tin-zinc, tin-zinc-indium, copper-based solders, and alloys thereof.

Figure 5:
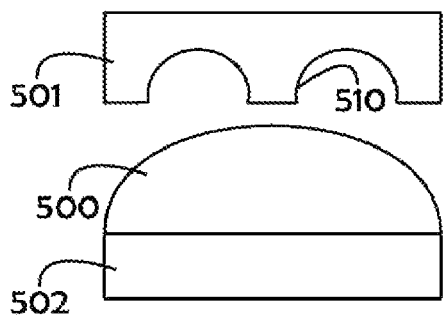
FIGS. 5 and 6 show a sculpted pad and the corresponding detachable mating with a bump.
Figure 6:
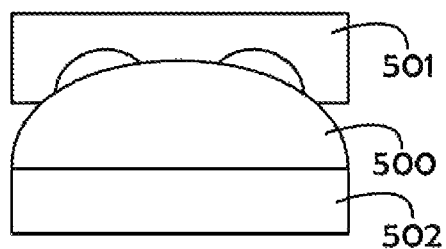

With reference to FIG. 5, another embodiment of the invention depicts a sculpted pad 501 on a decal opposite a bump 500 on a PWB pad 502. The rigid probes 510 of pads 501 are partially inserted into bump 500 to form a removable interconnection during the testing phase as shown in FIG. 6. Bump 500 may be a solder bump or an ECA bump as disclosed above. The insertion may be carried out at ambient temperatures and low pressure or bump 500 may be softened for even lower pressure insertion. No pressure is required after insertion. After the testing phase, the solder may be reflowed to wet the sculpted pad and form a durable bond. If bump 500 is an ECA bump, the pad is fully inserted into bump 500 and the adhesive resin fully cured to form the durable bond.

Still further, the compositions herein may include what is defined as mixture of solder where one solder will melt during at low temperature reflow but both solder will reflow melt only during final reflow process. One example is a mixture of tin-bismuth and tin-lead solder. At a low temperature reflow process, only tin-bismuth will melt and tin-lead will act as a conducting filler. But for the final joining process, high temperature reflow occurs where the tin-lead and tin-bismuth both will melt. It is also possible to use multiple low and high temperature solder in the mixture. One example is tin-bismuth as a low temperature solder and tin-lead or tin silver copper (SAC) as the high temperature solder.

Figure 7:
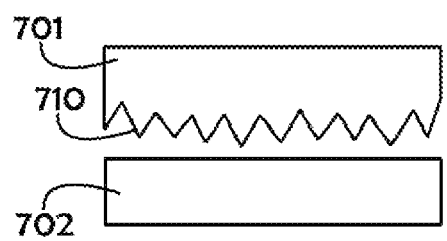
FIG. 7 depicts a dendritic pad detachably attached to a flat pad.

FIG. 7 depicts a low pressure electrical interconnection made between a rough pad 701 with dendritic protrusions 710 and a flat pad 702. Dendrites 710 on pad 701 may be made by any known method including pulse plating. Although dendrites 710 are shown on pad 701 on the decal and flat pad 702 is depicted on the PWB, the configuration may be reversed with dendrites 710 disposed on PWB pad 702. When dendrites 710 are compressed, reliable detachable electrical interconnections are made for testing. Permanent connection may be made subsequently in a secondary process using any conventional method, such as elevated temperature and pressure with appropriate surface finish (e.g., Sn or Sn—Pb).

Figure 8:
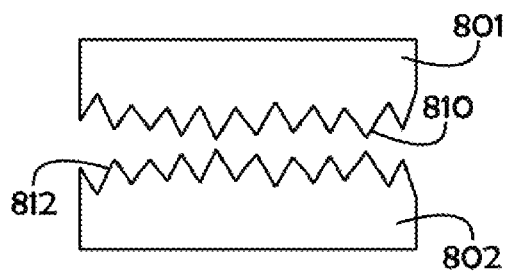
FIG. 8 depicts two dendritic pads in an interdigitating configuration to form a detachable joint.

In another variation of the above embodiment, as shown in FIG. 8, the corresponding pads 801 and 802 on the decal and the PWB, respectively, may have dendritic protrusions 810, 812. When compressed, the interdigitating dendrites 810, 812 make detachable electrical interconnections. If no rework is required, the interconnections are made permanent by known techniques, such as elevated temperature and pressure with appropriate surface finish (e.g., Sn or Sn—Pb).

Since other modifications and changes varied to fit particular operating requirements and environments will be apparent to those skilled in the art, this invention is not considered limited to the example chosen for purposes of this disclosure, and covers all changes and modifications which does not constitute departures from the true spirit and scope of this invention.

Having thus described the invention, what is desired to be protected by Letters Patent is presented in the subsequently appended claims.

What is claimed is:

1. A method of joining a semiconductor device/chip to a printed wiring board through a multilayer flexible substrate, the steps comprising:
    a) providing a semiconductor device having a first set of pads disposed on one surface thereof, said pads having predetermined small dimensions and a fine pitch;
    b) providing a printed wiring board having a first and a second surface, with a site on said first surface thereof for attaching a semiconductor device through a multilayer flexible substrate, the site having a second set of pads on said first surface of said printed wiring board with dimensions and spacing substantially greater than those of said first set of pads;
    c) providing a multilayer flexible substrate having a first surface with a first set of substrate pads having dimensions and spacing corresponding to said first set of pads on said semiconductor device, and a second surface with a second set of substrate pads having dimensions and spacing corresponding to said second set of pads on said first surface of said printed wiring board, the first set of substrate pads of said semiconductor device being in electrical communication, through the flexible substrate, with said second set of substrate pads on said first surface of said printed wiring board;
    d) joining the semiconductor device pads to said first set of substrate pads on said multilayer flexible substrate to obtain a flexible chip-on-a-carrier; and
    e) joining said second surface of said flexible chip-on-a-carrier to the site on said first side of said printed wiring board.

2. The method according to claim 1, wherein said joining step (e) is permanent, preventing said chip-on-a-carrier from being detached from said printed wiring board.

3. The method according to claim 1, wherein said joining step (d) is permanent, preventing said chip-on-a-carrier from being detached from said printed wiring board.

4. The method according to claim 1, wherein said joining step (d) is accomplished by a thermal process.

5. The method according to claim 1, wherein said joining step (e) is accomplished via an electrically conductive adhesive and said chip-on-a-carrier is detachable from said PWB by a thermal process.

6. The method according to claim 1, wherein said joining step (e) is accomplished in two steps comprising:
    i) a first step wherein the joining is temporary and said chip-on-a-carrier is detachable from said printed wiring board after the first step; and
    ii) based on the results of at least one test, a second step wherein the joining is made permanent by a subsequent process.

7. The method according to claim 6, wherein said joining step (e) is accomplished via an electrically conductive adhesive comprising conductive particles and a resin curable in at least one stage, wherein:
    a first step comprises a first stage cure and said chip-on-a-carrier is detachably joined to said printed wiring board; and
    an optional second step comprises a final cure whereby said chip-on-a-carrier is durably joined to said printed wiring board.

8. The method according to claim 7, wherein said resin comprises a blend of thermoplastic and thermoset resins, said first step comprises a low-temperature cure of said thermoplastic resin, and said second step comprises a final cure of said thermoset resin at a temperature greater than said low-temperature cure of said first step.

9. The method according to claim 7, wherein said resin comprises a blend of UV-curable and thermoset resins, said first step comprises UV-curing said UV-curable resin, and said second step comprises a final cure of said thermoset resin by a thermal process.

10. The method according to claim 6, wherein said joining step (e) is accomplished via a mixture of electrically conductive solder comprising conductive filler and a flowable solder in at least one stage, wherein:
    i) a first step comprises a first stage low temperature reflow whereby said chip-on-a-carrier is detachably joined to said printed wiring board; and
    ii) an optional second step comprises a high temperature reflow whereby said chip-on-a-carrier is durably joined to said printed wiring board.

11. The method according to claim 10, wherein said solder mix comprises a blend of tin-bismuth and tin-lead solders, said first step comprises a low-temperature reflow of said tin-bismuth solder, and said second step comprises a high temperature reflow of said tin-lead solder at a temperature greater than said low-temperature reflow of said first step.

12. The method according to claim 6, wherein said pads on said second surface of said decal are sculpted with protrusions, said pads on said printed wiring board have solder bumps, said first step comprises insertion of said sculpted pad into said solder bumps, and said second step comprises reflowing solder to wet said sculpted pad.

13. The method according to claim 6, wherein said pads on said second surface of said flexible substrate are provided with dendritic protrusions, and said first step comprises insertion of said dendritic protrusions into said pads on said printed wiring board.

14. The method according to claim 6, wherein said pads on said second surface of said flexible substrate and said pads on said printed wiring board are provided with dendritic protrusions and valleys, and said first step comprises insertion of said dendritic protrusions into the valleys of said opposing pads to thereby form a detachable interdigitating interconnection.

15. The method according to claim 1, wherein said pads are finished from the group: Sn and Au.

16. The method according to claim 15, wherein said attachment is made permanent by elevated temperature and pressure.

* * * * *